(12) United States Patent
Suenaga et al.

(10) Patent No.: US 10,557,003 B2
(45) Date of Patent: Feb. 11, 2020

(54) POLYIMIDE RESIN COMPOSITION

(71) Applicant: MITSUBISHI GAS CHEMICAL COMPANY, INC., Tokyo (JP)

(72) Inventors: Shuya Suenaga, Kanagawa (JP); Teruhisa Matsumaru, Kanagawa (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 374 days.

(21) Appl. No.: 14/430,341

(22) PCT Filed: Sep. 27, 2013

(86) PCT No.: PCT/JP2013/076262
§ 371 (c)(1),
(2) Date: Mar. 23, 2015

(87) PCT Pub. No.: WO2014/051050
PCT Pub. Date: Apr. 3, 2014

(65) Prior Publication Data
US 2015/0225523 A1    Aug. 13, 2015

(30) Foreign Application Priority Data
Sep. 27, 2012   (JP) ................. 2012-214324

(51) Int. Cl.
| C08K 3/36 | (2006.01) |
| C08L 79/08 | (2006.01) |
| B32B 27/28 | (2006.01) |
| C08J 5/18 | (2006.01) |
| B32B 15/088 | (2006.01) |
| B32B 27/20 | (2006.01) |
| B32B 17/06 | (2006.01) |

(52) U.S. Cl.
CPC ............. C08J 5/18 (2013.01); B32B 15/088 (2013.01); B32B 17/064 (2013.01); B32B 27/20 (2013.01); B32B 27/281 (2013.01); C08K 3/36 (2013.01); B32B 2264/102 (2013.01); B32B 2307/306 (2013.01); B32B 2307/412 (2013.01); B32B 2457/20 (2013.01); B32B 2457/202 (2013.01); B32B 2551/00 (2013.01); C08J 2379/08 (2013.01); Y10T 428/31623 (2015.04); Y10T 428/31681 (2015.04); Y10T 428/31721 (2015.04)

(58) Field of Classification Search
CPC ..... B32B 15/088; B32B 15/20; B32B 17/064; B32B 2264/102; B32B 2307/306; B32B 2307/412; B32B 2457/20; B32B 2457/202; B32B 2551/00; B32B 27/06; B32B 27/08; B32B 27/20; B32B 27/281; B32B 27/32; B32B 27/34; B32B 27/36; C08G 73/1039; C08G 73/1042; C08G 73/1078; C08K 3/36; C08L 79/08; C08J 5/18; C08J 2379/08; H05K 1/0346; H05K 1/0373; Y10T 428/31623; Y10T 428/31681; Y10T 428/31721
See application file for complete search history.

(56) References Cited

U.S. PATENT DOCUMENTS

| 4,927,736 A * | 5/1990 | Mueller ................. C08G 73/10 430/176 |
| 2003/0220455 A1* | 11/2003 | Ichiroku ................ C08G 59/18 525/418 |
| 2006/0068184 A1 | 3/2006 | Hamada et al. |
| 2007/0009751 A1 | 1/2007 | Hwang et al. |
| 2007/0066734 A1 | 5/2007 | Ding et al. |
| 2008/0038522 A1 | 2/2008 | Hamada et al. |
| 2008/0090927 A1* | 4/2008 | Ishii ................... C08G 73/1039 522/47 |
| 2008/0161473 A1 | 7/2008 | Leu et al. |
| 2009/0068482 A1 | 3/2009 | Bito et al. |
| 2011/0091732 A1 | 4/2011 | Lu et al. |
| 2011/0111333 A1* | 5/2011 | Cheng .................... G02B 5/201 430/7 |
| 2011/0269857 A1 | 11/2011 | Lee et al. |
| 2014/0316074 A1* | 10/2014 | Park .................. C08G 73/1067 525/435 |

FOREIGN PATENT DOCUMENTS

| CN | 1436815 | 8/2003 |
| CN | 102203168 | 9/2011 |
| CN | 104804189 A * | 7/2015 |
| EP | 1672009 | 6/2006 |
| JP | 09-176485 | 7/1997 |

(Continued)

OTHER PUBLICATIONS

Machine translation of JP 2011219672 (2011).*
Machine translation of WO 2010/044381. (Year: 2010).*
Database WPI Week 199913, Thomson Scientific, London GB; AN 1999-148724, XP002755801, & JP H11 12465 A (Nippon Telegraph & Telephone Corp); Jan. 19, 1999; Abstract.
Extended European Search Report issued in Patent Application No. 13841197.0, dated Apr. 14, 2016.
Search report from PCT/JP2013/076262, dated Jan. 7, 2014.
Gao et al., "Preparation and Heat Resisitance of PMDA-BPDA-HAB Polybenzoxazoles", Chinese Journal of Applied Chemistry, vol. 22 No. 10, Oct. 26, 2005, pp. 1096-1099.

(Continued)

Primary Examiner — John D Freeman
(74) Attorney, Agent, or Firm — Greenblum & Bernstein, P.L.C.

(57) ABSTRACT

Provided is a polyimide resin composition capable of forming a polyimide film which is excellent in transparency and heat resistance and has a low thermal linear expansion coefficient. The polyimide resin composition contains a polyimide resin produced by reacting (A) a tetracarboxylic dianhydride with (B) a diamine containing a phenolic hydroxyl group-containing diamine in an amount of from 5 to 100 mol % of the total diamine; and silica microparticles, in a ratio by mass of from 25/75 to 60/40.

10 Claims, No Drawings

(56) References Cited

FOREIGN PATENT DOCUMENTS

| | | |
|---|---|---|
| JP | 11-12465 | 1/1999 |
| JP | 2006-124685 | 5/2006 |
| JP | 2007-16200 | 1/2007 |
| JP | 2008-214412 A | 9/2008 |
| JP | 2008-214413 | 9/2008 |
| JP | 2009-215412 | 9/2009 |
| JP | 2011-148955 | 8/2011 |
| JP | 2011219672 A * | 11/2011 |
| TW | 200728355 | 8/2007 |
| TW | 201113327 | 4/2011 |
| WO | 2006/077964 | 7/2006 |
| WO | WO-2010044381 A1 * | 4/2010 ............ C08G 73/10 |

OTHER PUBLICATIONS

Chinses Office Action issued in Patent Appl. No. 201380050692.4, dated Feb. 15, 2016.

* cited by examiner

POLYIMIDE RESIN COMPOSITION

TECHNICAL FIELD

The present invention relates to a polyimide resin composition. More precisely, the present invention relates to a polyimide resin composition capable of forming a polyimide film excellent in transparency and heat resistance and having a low thermal linear expansion coefficient.

BACKGROUND ART

Recently, with the advent of a highly information-based society, materials satisfying both heat resistance and transparency have become desired in the field of optical communications including optical fibers, optical waveguides, etc., and in the field of display devices including liquid-crystal orientation films, color filters, etc.

In the field of display devices, an alternative technology of employing plastic substrates that are lightweight and are excellent in flexibility, in place of glass substrates, and a development of displays capable of being bent or rolled up are now under way. However, for example, when an electronic element comprising an inorganic material is formed on a film, then the film having the inorganic element formed thereon may bend and, as the case may be, the inorganic element may often peel away from the film, since the inorganic material and the film significantly differ in point of the linear expansion coefficient. Accordingly, it is desired to develop a resin material for films having both transparency and heat resistance and having a low thermal linear expansion coefficient.

Polyimide has excellent heat resistance and additionally has other excellent properties of mechanical characteristics, chemical resistance, electric characteristics and the like, and therefore films formed of a material of polyimide are widely used in various fields of molding materials, composite materials, electric and electronic components, display devices, etc. However, those films are further required to have higher transparency and dimensional stability than ever.

In general, it is known that polyimides having the polymer chains which are more rigid and have a higher linearity have a lower thermal linear expansion coefficient, and for improving the dimensional stability of polyimides by lowering the thermal linear expansion coefficient thereof, various structures of both acid dianhydrides and diamines that are source materials of polyimides have heretofore been proposed.

PTL 1 discloses a polyimide film containing a specific repeating unit, which is excellent in heat resistance and linear expansion coefficient. However, the polyimide film disclosed in PTL 1 is strong in yellow, that is, it has a YI value of around 15 when having a thickness of 50 μm, and therefore, for realizing sufficient transparency, it is desired to further reduce the coloration of the film.

PTL 2 discloses a polyamic acid resin composition containing from 0.3 to 15% by weight of a nanolayer silica sheet and/or a nanometer silica powder, and a polyimide film formed of the composition and having characteristics of low water absorbability, high transparency and high dimensional stability. However, the polyimide film disclosed in PTL 2 has a transmittance of from 30 to 40% when having a thickness of 25 μm, and depending on the intended use thereof, the transparency of the film would have to be further increased. In addition, when the silica content is increased for enhancing the heat resistance and the dimensional stability, the transparency of the film is expected to lower.

PTL 3 discloses a polyimide resin produced by reacting a 1,2,4,5-cyclohexanetetracarboxylic acid derivative component with a diamine component having a specific skeleton, a polyimide varnish containing the polyamide resin and silica microparticles, and a polyimide molded product excellent in transparency and flexibility, which is produced by molding it. However, the polyimide molded product disclosed in PTL 3 is excellent in transparency but is problematic in that the thermal linear expansion coefficient is high.

PTL 4 discloses a polyimide film mainly containing silicon dioxide microparticles having a specific particle size and a polyimide. However, the films disclosed in Examples in PTL 4 have a light transmittance of 90% when having a thickness of about 13 μm, and in addition, the mean thermal expansion coefficient thereof is more than 50 ppm, and therefore, the film is desired to be improved in point of both the transparency and the thermal expansion coefficient thereof.

CITATION LIST

Patent Literature

PTL 1: JP-A 2011-148955
PTL 2: JP-A 2007-16200
PTL 3: JP-A 2009-215412
PTL 4: JP-A 11-12465

SUMMARY OF INVENTION

Technical Problem

An object of the present invention is to provide a polyimide resin composition capable of forming a polyimide film excellent in transparency and heat resistance and having a low thermal linear expansion coefficient.

Solution to Problem

The present inventors have found that, when a polyimide resin composition containing a polyimide resin produced by reacting a tetracarboxylic dianhydride with a diamine which contains a specific amount of a phenolic hydroxyl group-containing diamine; and silica microparticles in a specific ratio by mass, is used, then the above-mentioned problems can be solved, and have completed the present invention.

Specifically, the present invention relates to the following [1] to [13]:

[1] A polyimide resin composition containing:
a polyimide resin produced by reacting (A) a tetracarboxylic dianhydride with (B) a diamine containing a phenolic hydroxyl group-containing diamine in an amount of from 5 to 100 mol % of the total diamine; and
silica microparticles,
in a ratio by mass of from 25/75 to 60/40.

[2] The polyimide resin composition according to the above [1], wherein the tetracarboxylic dianhydride (A) is a cycloalkanetetracarboxylic dianhydride.

[3] The polyimide resin composition according to the above [2], wherein the cycloalkanetetracarboxylic dianhydride is 1,2,4,5-cyclohexanetetracarboxylic dianhydride.

[4] The polyimide resin composition according to any of the above [1] to [3], wherein the phenolic hydroxyl group-containing diamine contains a diamine represented by the following general formula (1):

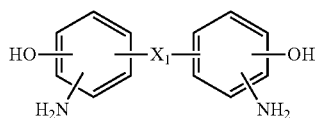

(In the formula, $X_1$ represents a direct bond, —$CH_2$—, —O—, —S—, —$SO_2$—, —CONH—, —CO—, or —$C(CH_3)_2$—.)

[5] The polyimide resin composition according to the above [4], wherein the diamine represented by the general formula (1) is a diamine represented by the following general formula (2):

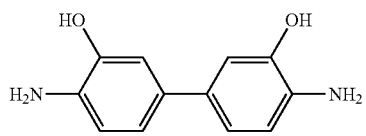

[6] The polyimide resin composition according to any of the above [1] to [5], wherein the diamine (B) contains from 10 to 95 mol % of the phenolic hydroxyl group-containing diamine and from 5 to 90 mol % of 2,2'-bis(trifluoromethyl)benzidine.

[7] The polyimide resin composition according to the above [6], wherein the diamine (B) consists of from 10 to 95 mol % of the phenolic hydroxyl group-containing diamine represented by the general formula (1) and from 5 to 90 mol % of 2,2'-bis(trifluoromethyl)benzidine.

[8] The polyimide resin composition according to any of the above [1] to [7], wherein the silica microparticles have a mean particle size of from 1 to 100 nm.

[9] The polyimide resin composition according to any of the above [1] to [8], wherein the silica microparticles are ones surface-treated with an amino group-containing silane coupling agent.

[10] A polyimide film formed using the polyimide resin composition of any of the above [1] to [9].

[11] The polyimide film according to the above [10], which has a total light transmittance of 85% or more when having a thickness of 50 μm.

[12] A laminate having:
a substrate selected from plastic film, silicon wafer, metal foil and glass; and
a polyimide resin layer formed using the polyimide resin composition of any of the above [1] to [9].

[13] The laminate according to the above [12], wherein the substrate is copper foil.

Advantageous Effects of Invention

The polyimide resin composition of the present invention contains a polyimide resin having a specific structure, which has a high affinity for silica microparticles of an inorganic substance, and therefore, the dispersibility of the silica microparticles in the composition is good and the content of the silica microparticles in the composition can be increased. Consequently, the polyimide film formed using the polyimide resin composition of the present invention is excellent in transparency and heat resistance and has a low thermal linear expansion coefficient, and therefore undergoes little dimensional change by heat, and is favorably used as films for various members. Concretely, use of the composition for color filters, flexible displays, semiconductor members, optical members and the like is expected.

DESCRIPTION OF EMBODIMENTS

[Polyimide Resin Composition]
The polyimide resin composition of the present invention contains: a polyimide resin produced by reacting (A) a tetracarboxylic dianhydride with (B) a diamine containing a phenolic hydroxyl group-containing diamine in an amount of from 5 to 100 mol % of the total diamine; and silica microparticles, in a ratio by mass of from 25/75 to 60/40.
(Polyimide Resin)
The polyimide resin contained in the polyimide resin composition of the present invention is one produced by reacting (A) a tetracarboxylic dianhydride with (B) a diamine containing a phenolic hydroxyl group-containing diamine in an amount of from 5 to 100 mol % of the total diamine.
<Tetracarboxylic Dianhydride (A)>
The tetracarboxylic dianhydride (A) for use in the present invention includes an aromatic tetracarboxylic dianhydride and an aliphatic tetracarboxylic dianhydride.

Specific examples of the aromatic tetracarboxylic dianhydride include 3,3',4,4'-diphenylsulfone-tetracarboxylic dianhydride, 3,3',4,4'-benzophenone-tetracarboxylic dianhydride, 4,4,'-oxydiphthalic dianhydride, pyromellitic dianhydride, 2,2',3,3'-benzophenone-tetracarboxylic dianhydride, 3,3',4,4'-biphenyltetracarboxylic dianhydride, 2,2',3,3'-biphenyltetracarboxylic dianhydride, 2,2-bis(3,4-dicarboxyphenyl)propane dianhydride, 2,2-bis(2,3-dicarboxyphenyl)propane dianhydride, 2,2-bis(3,4-dicarboxyphenoxyphenyl)propane dianhydride, 1,1-bis(2,3-dicarboxyphenyl)ethane dianhydride, 1,2-bis(2,3-dicarboxyphenyl)ethane dianhydride, 1,1-bis(3,4-dicarboxyphenyl)ethane dianhydride, 1,2-bis(3,4-dicarboxyphenyl)ethane dianhydride, bis(2,3-dicarboxyphenyl)methane dianhydride, bis(3,4-dicarboxyphenyl)methane dianhydride, 4,4'-(p-phenylenedioxy)diphthalic dianhydride, 4,4'-(m-phenylenedioxy)diphthalic dianhydride, 2,3,6,7-naphthalenetetracarboxylic dianhydride, 1,4,5,8-naphthalenetetracarboxylic dianhydride, etc. One alone or two or more of these may be used here either singly or as combined.

The aliphatic tetracarboxylic dianhydride includes a cyclic or acyclic aliphatic tetracarboxylic dianhydride. The cyclic aliphatic tetracarboxylic dianhydride is a tetracarboxylic dianhydride having an alicyclic hydrocarbon structure, and specific examples thereof include cycloalkane-tetracarboxylic dianhydrides such as 1,2,4,5-cyclohexanetetracarboxylic dianhydride, 1,2,3,4-cyclobutanetetracarboxylic dianhydride, 1,2,4,5-cyclopentanetetracarboxylic dianhydride, etc.; bicyclo[2.2.2]oct-7-ene-2,3,5,6-tetracarboxylic dianhydride, dicyclohexyltetracarboxylic dianhydride, and their regioisomers. One alone or two or more of these may be used here either singly or as combined.

Specific examples of the alicyclic aliphatic tetracarboxylic dianhydride include 1,2,3,4-butanetetracarboxylic dianhydride, 1,2,3,4-pentanetetracarboxylic dianhydride, etc. One alone or two or more of these may be used here either singly or as combined.

Of the above-mentioned tetracarboxylic dianhydrides, preferred is use of aliphatic tetracarboxylic dianhydrides from the viewpoint of transparency, heat resistance, low linear expansion coefficient and coloration resistance, and from the viewpoint of easiness in producing high-molecular weight polyimides. More preferred is use of cycloalkane-tetracarboxylic dianhydrides, even more preferred is use of cycloalkane-tetracarboxylic dianhydrides having a number of the ring-constituting carbon atoms of from 4 to 6, and still more preferred is use of 1,2,4,5-cyclohexanetetracarboxylic dianhydride.

In general, when an aliphatic diamine is used as the diamine (B) to be mentioned below as the raw material for a polyimide resin, polyamide acid produced as an intermediate product and the aliphatic diamine form a hard complex, and therefore a high-molecular weight polyimide is difficult to form. However, when a 1,2,4,5-cyclohexanetetracarboxylic dianhydride and an aliphatic diamine are used, a complex in which the bonding between the polyamide acid and the aliphatic diamine is relatively weak is formed, and therefore the polyimide can be readily made to have an increased molecular weight.

The polyimide resin for use in the present invention may be those further reacted with one or more compounds selected from a tetracarboxylic acid or any other tetracarboxylic acid derivative than the tetracarboxylic dianhydride (A), for example, pyromellitic acid, 3,3',4,4'-biphenyltetracarboxylic acid, 2,3,3',4'-biphenyltetracarboxylic acid, 2,2-bis(3,4-dicarboxyphenyl)propane, 2,2-bis(2,3-dicarboxyphenyl)propane, 2,2-bis(3,4-dicarboxyphenyl)-1,1,1,3,3,3-hexafluoropropane, 2,2-bis(2,3-dicarboxyphenyl)-1,1,1,3,3,3-hexafluoropropane, bis(3,4-dicarboxyphenyl) sulfone, bis(3,4-dicarboxyphenyl)ether, bis(2,3-dicarboxyphenyl) ether, 3,3',4,4'-benzophenonetetracarboxylic acid, 2,2',3,3'-benzophenonetetracarboxylic acid, 4,4-(p-phenylenedioxy)diphthalic acid, 4,4-(m-phenylene dioxy)diphthalic acid, ethylenetetracarboxylic acid, 1,1-bis(2,3-dicarboxyphenyl)ethane, bis(2,3-dicarboxyphenyl)methane, bis(3,4-dicarboxyphenyl)methane and their derivatives, within a range not detracting from the physical properties of the resultant polyimide film.

The amount to be used of the tetracarboxylic acid or the other tetracarboxylic acid derivative than the tetracarboxylic dianhydride (A) is preferably 10 mol % or less of the total tetracarboxylic dianhydride (A), more preferably 5 mol % or less, even more preferably 1 mol % or less.

<Diamine (B)>

The diamine (B) for use in the present invention includes a phenolic hydroxyl group-containing diamine in an amount of from 5 to 100 mol % of the total diamine.

The phenolic hydroxyl group-containing diamine used here introduces the hydroxyl group into the structure of the polyimide resin for use in the present invention, therefore enhancing the affinity of the resultant resin with silica microparticles which is a kind of an inorganic material. Accordingly, the dispersibility of the silica microparticles in the polyimide resin composition is thereby bettered, and the content of the silica microparticles to be in the composition may be increased, and it is possible to provide a polyimide film excellent in transparency and heat resistance and having a small thermal linear expansion coefficient.

[Phenolic Hydroxyl Group-Containing Diamine]

The phenolic hydroxyl group-containing diamine to be contained in the diamine (B) is not specifically defined as long as the diamine has a phenolic skeleton in the molecule, but preferably, the phenolic hydroxyl group-containing diamine contains a diamine represented by the following general formula (1). The diamine represented by the general formula (1) is preferred from the viewpoint of realizing the advantageous effects of the present invention and from the viewpoint of easy availability thereof.

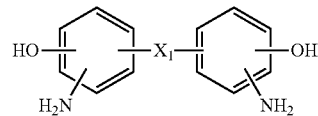

(1)

(In the formula, $X_1$ represents a direct bond, —CH$_2$—, —O—, —S—, —SO$_2$—, —CONH—, —CO—, or —C(CH$_3$)$_2$—.)

In the above-mentioned general formula (1), preferably, $X_1$ is at least one selected from a direct bond, —CH$_2$—, —O—, —SO$_2$—, —CO— and —C(CH$_3$)$_2$—.

The diamine represented by the above general formula (1) is preferably at least one selected from the diamines represented by the following general formulae (2) to (6); and from the viewpoint of the low thermal linear expansion coefficient thereof, more preferred is a diamine represented by the following general formula (2) (namely 3,3'-dihydroxybenzidine).

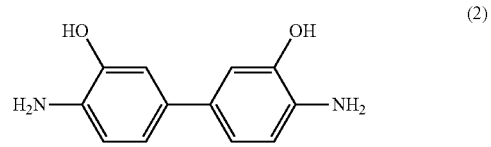

(2)

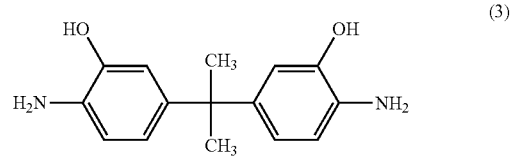

(3)

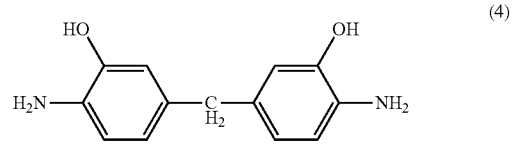

(4)

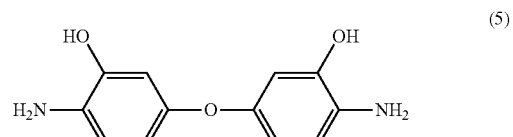

(5)

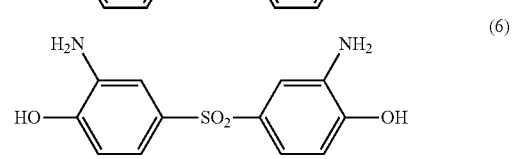

(6)

One alone or two or more of the above-mentioned phenolic hydroxyl group-containing diamines may be used here either singly or as combined.

The content of the phenolic hydroxyl group-containing diamine in the diamine (B) is from 5 to 100 mol % of the total diamine, preferably from 5 to 90 mol %, more preferably from 10 to 70 mol %, even more preferably from 10 to 50 mol %, still more preferably from 15 to 50 mol %, still further more preferably from 15 to 40 mol %, from the viewpoint of the transparency, the heat resistance and the low thermal linear expansion coefficient of the resultant polyimide resin composition and the polyimide film.

[Other Diamines]

The diamine (B) for use in the present invention may contain any other diamine than the above-mentioned phenolic hydroxyl group-containing diamine, from the viewpoint of the transparency, the heat resistance and the low thermal linear expansion coefficient of the resultant polyimide resin composition and the polyimide film.

Not specifically defined, the other diamine may be an aliphatic diamine, an aromatic diamine or a mixture thereof. In the present invention, "aromatic diamine" means a diamine in which the amino group directly bonds to an aromatic ring, and the diamine of the type may contain an aliphatic group or any other substituent in a part of the structure thereof. The aromatic ring may be a single ring or a condensed ring, including, for example, a benzene ring, a naphthalene ring, an anthracene ring, a fluorene ring, a tetracene ring, etc. However, the invention is not limited to these. Of those, preferred is at least one selected from a benzene ring, a naphthalene ring and a fluorene ring, and more preferred is a benzene ring. "Aliphatic diamine" means a diamine in which the amino group directly bonds to an aliphatic group, and the diamine of the type may contain an aromatic ring and any other substituent in a part of the structure thereof.

The aliphatic diamine includes, for example, acyclic aliphatic diamines such as ethylenediamine, hexamethylenediamine, polyethylene glycol bis(3-aminopropyl)ether, polypropylene glycol bis(3-aminopropyl)ether, etc.; cyclic aliphatic diamines such as 1,3-bis(aminomethyl)cyclohexane, 1,4-bis(aminomethyl)cyclohexane, isophoronediamine, norbornanediamine, 4,4'-diaminodicyclohexylmethane, etc.; and siloxanediamines, etc. One alone or two or more of these may be used here either singly or as combined.

The aromatic diamine includes, for example, aromatic diamines having one aromatic ring, such as m-xylylenediamine, p-xylylenediamine, 1,4-phenylenediamine, 1,3-phenylenediamine, 2,4-toluenediamine, 2,6-diaminonaphthalene, 1,5-diaminonaphthalene, etc.; aromatic diamines having two or more aromatic rings, such as 2,2'-bis(trifluoromethyl)benzidine, 4,4'-bis(4-aminophenoxy)biphenyl, 4,4'-diaminodiphenyl ether, 3,4'-diaminodiphenyl ether, 4,4'-diaminodiphenylmethane, 1,4-bis(4-aminophenoxy)benzene, 1,3-bis(4-aminophenoxy)benzene, 4,4'-diaminodiphenyl sulfone, bis[4-(4-aminophenoxy)phenyl]sulfone, bis[4-(3-aminophenoxy)phenyl]sulfone, 9,9-bis(4-aminophenyl)fluorene, 9,9-bis(2-methyl-4-aminophenyl)fluorene, etc. One alone or two or more of these may be used here either singly or as combined.

Of the other diamines mentioned above, preferred is use of aromatic diamines from the viewpoint of heat resistance and low thermal linear expansion coefficient; more preferred is use of aromatic diamines having two or more aromatic rings; even more preferred is use of one or more selected from 2,2'-bis(trifluoromethyl)benzidine, 4,4'-bis(4-aminophenoxy) biphenyl and 4,4'-diaminodiphenyl ether; and from the viewpoint of transparency, further more preferred is use of 2,2'-bis(trifluoromethyl)benzidine.

From the viewpoint of colorless transparency and low thermal linear expansion coefficient, the diamine (B) for use in the present invention preferably contains from 10 to 95 mol % of a phenolic hydroxyl group-containing diamine and from 5 to 90 mol % of 2,2'-bis(trifluoromethyl)benzidine. Preferred types of the phenolic hydroxyl group-containing diamine are the same as those mentioned hereinabove. In this case, the content of the phenolic hydroxyl group-containing diamine in the diamine (B) is more preferably from 10 to 70 mol %, even more preferably from 10 to 50 mol %, still more preferably from 15 to 50 mol %, still further more preferably from 15 to 40 mol %. The content of the 2,2'-bis(trifluoromethyl)benzidine in the diamine (B) is more preferably from 30 to 90 mol %, even more preferably from 50 to 90 mol %, still more preferably from 50 to 85 mol %, still further more preferably from 60 to 85 mol %.

From the viewpoint of colorless transparency and low thermal linear expansion coefficient, it is especially preferable that the diamine (B) for use in the present invention consists of from 10 to 95 mol % of a phenolic hydroxyl group-containing diamine represented by the above-mentioned general formula (1) and from 5 to 90 mol % of 2,2'-bis(trifluoromethyl)benzidine.

Preferred types of the phenolic hydroxyl group-containing diamine represented by the general formula (1) are the same as those mentioned above. In this case, the content of the phenolic hydroxyl group-containing diamine represented by the general formula (1) in the diamine (B) is more preferably from 10 to 70 mol %, even more preferably from 10 to 50 mol %, still more preferably from 15 to 50 mol %, still further more preferably from 15 to 40 mol %. The content of the 2,2'-bis(trifluoromethyl)benzidine in the diamine (B) is more preferably from 30 to 90 mol %, even more preferably from 50 to 90 mol %, still more preferably from 50 to 85 mol %, still further more preferably from 60 to 85 mol %.

<Production of Polyimide Resin>

The method for producing the polyimide resin for use in the present invention, by reacting the above-mentioned tetracarboxylic dianhydride (A) with the diamine (B), is not specifically defined, for which employable is any known method.

Concrete reaction methods include (1) a method of putting the tetracarboxylic dianhydride (A) and the diamine (B) into a reactor along with a reaction solvent thereinto, then stirring them at room temperature to 80° C. for 0.5 to 30 hours, and thereafter heating them for imidation, (2) a method of putting the diamine (B) and a reaction solvent into a reactor and dissolving them, then putting the tetracarboxylic dianhydride (A) thereinto, stirring them at room temperature to 80° C. for 0.5 to 30 hours, and thereafter heating them for imidation, (3) a method of putting the tetracarboxylic dianhydride (A) and the diamine (B) into a reactor along with a reaction solvent thereinto, and then immediately heating them for imidation.

In producing the polyimide resin, the mixing ratio of the tetracarboxylic dianhydride (A) and the diamine (B) is preferably such that the amount of the diamine (B) is from 0.9 to 1.1 mols relative to 1 mol of the tetracarboxylic dianhydride (A).

<Reaction Solvent>

The reaction solvent for use in producing the polyimide resin in the present invention may be any one which is capable of dissolving the formed polyimide resin and does not interfere with the imidation reaction. For example, there are mentioned an aprotic solvent, a phenolic solvent, an ether solvent, a carbonate solvent, etc.

Specific examples of the aprotic solvent include amide solvents such as N,N-dimethylformamide, N,N-dimethylacetamide, N-methyl-2-pyrrolidone, N-methylcaprolactam, 1,3-dimethylimidazolidinone, tetramethylurea, etc.; lactone solvents such as γ-butyrolactone, γ-valerolactone, etc.; phosphorus-containing amide solvents such as hexamethylphosphoric amide, hexamethylphosphine triamide, etc.; sulfur-containing solvents such as dimethyl sulfone, dimethyl sulfoxide, sulfolane, etc.; ketone solvents such as acetone, cyclohexane, methylcyclohexane, etc.; amine solvents such as picoline, pyridine, etc.; ester solvents such as (2-methoxy-1-methylethyl)acetate, etc.

Specific examples of the phenolic solvent include phenol, o-cresol, m-cresol, p-cresol, 2,3-xylenol, 2,4-xylenol, 2,5-xylenol, 2,6-xylenol, 3,4-xylenol, 3,5-xylenol, etc.

Specific examples of the ether solvent include 1,2-dimethoxyethane, bis(2-methoxyethyl) ether, 1,2-bis(2-methoxyethoxy)ethane, bis[2-(2-methoxyethoxyl)ethyl]ether, tetrahydrofuran, 1,4-dioxane, etc.

Specific examples of the carbonate solvent include diethyl carbonate, methylethyl carbonate, ethylene carbonate, propylene carbonate, etc.

Of those reaction solvents, preferred are amide solvents and lactone solvents. One alone or two or more of these reaction solvents may be used here either singly or as combined.

For the imidation, preferably, a Dean Stark apparatus or the like is used while removing water formed during the production process. The operation may increase the degree of polymerization and the imidation ratio.

Any known imidation catalyst may be used in the imidation. The imidation catalyst includes a base catalyst and an acid catalyst.

The base catalyst includes organic base catalysts such as pyridine, quinoline, isoquinoline, α-picoline, β-picoline, 2,4-lutidine, 2,6-lutidine, trimethylamine, triethylamine, tripropylamine, tributylamine, imidazole, N,N-dimethylaniline, N,N-diethylaniline, etc.; inorganic base catalysts such as potassium hydroxide, sodium hydroxide, potassium carbonate, sodium carbonate, potassium hydrogencarbonate, sodium hydrogencarbonate, etc.

The acid catalyst includes crotonic acid, acrylic acid, trans-3-hexenoic acid, cinnamic acid, benzoic acid, methylbenzoic acid, oxybenzoic acid, terephthalic acid, benzenesulfonic acid, paratoluenesulfonic acid, naphthalenesulfonic acid, etc.

Of the above, preferred is use of base catalysts from the viewpoint of the handleability thereof, more preferred is use of organic base catalysts, and even more preferred is use of triethylamine.

The temperature of the imidation is preferably from 120 to 250° C., more preferably from 160 to 190° C., from the viewpoint of enhancing the reactivity and preventing gelation. Also preferably, the reaction time after the start of distillation of the produced water is from 0.5 to 10 hours.

The polyimide resin for use in the present invention is obtained by reacting the tetracarboxylic dianhydride (A) with the diamine (B) preferably according to the above-mentioned method. The number-average molecular weight of the polyimide resin for use in the present invention is preferably from 5,000 to 500,000, from the viewpoint of the strength of the resultant polyimide film. The number-average molecular weight of the polyimide resin may be measured through gel permeation chromatography.

(Silica Microparticles)

The polyimide resin composition of the present invention contains the above-mentioned polyimide resin and silica microparticles.

Silica for the silica microparticles is silicon dioxide ($SiO_2$), and the morphology (crystalline morphology, amorphousness, etc.) thereof is not defined. The shape of the silica microparticles is not also defined, including spherical, oval, flat, rod-shaped, fibrous and the like ones.

The silica microparticles for use in the present invention preferably have a small particle size, from the viewpoint of realizing high light transmittance of the polyimide resin composition and the polyimide film, and the mean particle size thereof is preferably from 1 to 100 nm, more preferably from 1 to 50 nm, even more preferably from 2 to 25 nm, still more preferably from 5 to 20 nm.

The mean particle size of the silica microparticles may be measured, for example, according to a BET method.

The silica microparticles may be surface-treated with a surface-treating agent such as a silane coupling agent or the like, from the viewpoint of the dispersibility thereof in polyimide resin.

Any known silane coupling agent is usable here. From the viewpoint of the affinity thereof with polyimide resin, preferred is an amino group-containing silane coupling agent. The amino group-containing silane coupling agent includes, for example, 3-(2-aminoethylamino)propyldimethoxymethylsilane, 3-(2-aminoethylamino)propyltrimethoxysilane, 3-(2-aminoethylamino)propyltriethoxysilane, 3-(3-aminopropylamino)propyltriethoxysilane, 3-(3-aminopropylamino)propyltrimethoxysilane, 3-aminopropyldiethoxymethylsilane, 3-aminopropyltriethoxysilane, 3-aminopropyltrimethoxysilane, etc. One alone or two or more of these may be used here either singly or as combined.

The surface-treating method for the silica microparticles with a silane coupling agent is not specifically defined, for which, employable is any known method. For example, silica microparticles are dispersed in an organic solvent or the like to prepare a dispersion, and the above-mentioned silane coupling agent is added thereto, and stirred at a temperature falling between room temperature and 80° C. or so for several hours. A small amount of water may be added to the system to promote the treating reaction.

The polyimide resin composition of the present invention contains the above-mentioned polyimide resin and silica microparticles in a ratio by mass of from 25/75 to 60/40. When the ratio by mass of the polyimide resin is less than 25, then the flexibility of the resultant polyimide film may lower; but when the ratio by mass of the polyimide resin is more than 60, then the heat resistance of the resultant polyimide resin composition and the polyimide film may lower and the thermal linear expansion coefficient thereof may increase.

The ratio by mass of the polyimide resin and silica microparticles is preferably from 30/70 to 60/40, more preferably from 30/70 to 50/50, even more preferably from 40/60 to 50/50, from the viewpoint of realizing transparency, heat resistance and a low thermal linear expansion coefficient.

(Other Components)

The polyimide resin composition of the present invention may contain any other additive than the above-mentioned polyimide resin and silica microparticles, within a range not detracting from the advantageous effects of the present invention. For example, the composition may contain an antioxidant, a light stabilizer, a surfactant, a flame retardant, a plasticizer, a UV absorbent, any other polymer compound than the above-mentioned polyimide resin, etc.

<Preparation of Polyimide Resin Composition>

The method for preparing the polyimide resin composition of the present invention is not specifically defined. For example, the composition may be prepared by mixing and stirring the reaction liquid of polyimide resin obtained through reaction of the tetracarboxylic dianhydride (A) and the diamine (B) in the manner as mentioned above, with silica microparticles and any other optional component.

In preparing the polyimide resin composition, a dispersion where silica microparticles are dispersed in an organic solvent or the like may be used, or a powder of silica microparticles produced as colloidal silica according to a vapor-phase method may be used.

The organic solvent for use in the dispersion of silica microparticles includes methanol, isopropanol, ethylene glycol, methyl ethyl ketone, N-methyl-2-pyrrolidone, N, N-dimethylformamide, N,N-dimethylacetamide, etc. From the viewpoint of the solubility therein of polyimide resin, preferred is at least one selected from N-methyl-2-pyrrolidone, N,N-dimethylformamide and N,N-dimethylacetamide.

The solid concentration in the polyimide resin composition of the present invention may be suitably selected in accordance with the processability of the composition in forming polyimide films and laminates to be mentioned below. The solid concentration and the viscosity of the composition may be suitably controlled by adding an organic solvent thereto.

Not specifically defined, the organic solvent may be any one capable of dissolving polyimide resin. From the viewpoint of the solubility therein of polyimide resin, preferred is at least one selected from N-methyl-2-pyrrolidone, 1,3-dimethylimidazolidinone, N, N-dimethylformamide and N,N-dimethylacetamide.

[Polyimide Film]

The polyimide film of the present invention is formed using the polyimide resin composition, and therefore has transparency and heat resistance and has a low thermal linear expansion coefficient.

The method for forming the polyimide film of the present invention is not specifically defined, for which employable is any known method. For example, there is mentioned a method of forming the polyimide resin composition of the present invention containing an organic solvent into a film by coating or by shaping, and then removing the organic solvent. As the organic solvent, preferably used are the same solvents for reaction as those used in producing the polyimide resin in the above.

The thickness of the polyimide film of the present invention may be suitably selected in accordance with the intended use thereof. Preferably, the thickness is from 0.1 to 500 µm, more preferably from 1 to 250 µm.

The total light transmittance of the polyimide film of the present invention is preferably 85% or more, more preferably 90% or more, when the thickness thereof is 50 µm.

The thermal linear expansion coefficient of the polyimide film of the present invention is preferably 50 ppm/° C. or less, more preferably 40 ppm/° C. or less, even more preferably 35 ppm/° C. or less, and the glass transition temperature thereof is from the viewpoint of the heat resistance thereof, preferably 300° C. or higher, more preferably 320° C. or higher.

The total light transmittance, the thermal linear expansion coefficient and the glass transition temperature of polyimide film can be measured concretely according to the methods described in the section of Examples.

[Laminate]

The present invention also provides a laminate having a substrate selected from plastic film, silicon wafer, metal foil and glass, and a polyimide resin layer formed using the polyimide resin composition of the present invention.

<Substrate>

The substrate for use in the laminate of the present invention is selected from plastic film, silicon wafer, metal foil and glass.

The resin to constitute the plastic film includes, for example, polyolefins such as homopolymers or copolymers of ethylene, propylene, isobutene, etc.; amorphous polyolefins such as cyclic polyolefins, etc.; polyesters such as polyethylene terephthalate, polyethylene-2,6-naphthalate, etc.; polyamides such as nylon 6, nylon 66, nylon 12, copolymer nylon, etc.; polyvinyl alcohol, ethylene-vinyl acetate copolymer partial hydrolyzate (EVOH), polyimide, polyether imide, polysulfone, polyether sulfone, polyether ether ketone, polycarbonate, polyarylate, fluororesin, acrylic resin; biodegradable resins such as polylactic acid, etc. Of those, preferred are polyethylene 2,6-naphthalate, polyimide, polyether imide, polysulfone, polyether sulfone and polycarbonate, from the viewpoint of heat resistance and dimensional stability.

As the metal which constitutes the metal foil, any metal may be used as long as it has electroconductivity. Examples thereof include gold, silver, copper, iron and nickel. Of those preferred is silver or copper, and more preferred is copper.

Of the above-mentioned substrate, preferred is metal foil, and more preferred is copper foil.

The thickness of the substrate may be suitably selected in accordance with the intended use of the laminate, and is preferably from 0.1 to 500 µm, more preferably from 1 to 250 µm.

<Polyimide Resin Layer>

The polyimide resin layer to be used for the laminate of the present invention is formed using the polyimide resin composition of the present invention, and the polyimide resin composition is as described hereinabove. The thickness of the polyimide resin layer may be suitably selected in accordance with the intended use of the laminate, and is preferably from 0.5 to 50 µm, more preferably from 1 to 10 µm.

The production method for the laminate of the present invention is not specifically defined, for which employable is any known method. For example, there may be mentioned a method comprising applying the polyimide resin composition of the present invention containing an organic solvent onto a substrate, followed by removing the organic solvent.

The polyimide resin composition and the polyimide film of the present invention are favorably used as films for various members. Concretely, there are mentioned color filters, flexible displays, semiconductor members, optical members, etc. The laminate of the present invention is favorably used as a substrate for printed-wiring assemblies.

EXAMPLES

Examples of the present invention are described below; however, the present invention is not whatsoever limited by these Examples.

The polyimide films produced in Examples and Comparative Examples were evaluated as follows:

(1) Glass Transition Temperature

Using a differential scanning thermometer (DSC 6200, manufactured by SII Nano Technology Inc.), DSC measurement was carried out under the condition of a heating rate of 10° C./min to obtain a glass transition temperature.

(2) Thermal Linear Expansion Coefficient

Using a thermal mechanical analyzer (TMA/SS 6100, manufactured by SII Nano Technology Inc.), TMA measurement was carried out under the condition of a heating rate of 10° C./min to obtain a thermal linear expansion coefficient in the range of from 100 to 200° C.

(3) Total Light Transmittance

Total light transmittance was measured using color/turbidity coincidence measuring instrument (COH 400, manufactured by Nippon Denshoku Industries Co., Ltd.).

(4) Number-Average Molecular Weight

The number-average molecular weight of the polyimide resin was measured using a gel permeation chromatography apparatus by Shimadzu Corporation (liquid feeding unit: LC-20AD, autosampler: SIL-10AXL) under the condition mentioned below.

<Measurement Condition>

Detector: differential refractivity detector RI, RI-8020 Model (by Tosoh Corporation)
Column: TSKgel α-M (by Tosoh Corporation)
Column Temperature: 23° C.
Flow Rate: 0.8 mL/min
Standard Sample: monodispersed polystyrene (by Tosoh Corporation)

Production Example 1

Synthesis of 1,2,4,5-cyclohexanetetracarboxylic dianhydride 552 g of pyromellitic acid, 200 g of a catalyst of rhodium held on active carbon (by N.E. Chemcat Corporation), and 1656 g of water were put into a hastelloy (HC22) autoclave having an inner volume of 5 liters, and while stirring, the reactor was purged with nitrogen gas. Next, the reactor was purged with hydrogen gas so that the hydrogen pressure in the reactor could be 5.0 MPa, and heated up to 60° C. While the hydrogen pressure was kept at 5.0 MPa, this was reacted for 2 hours. The hydrogen gas in the reactor was purged with nitrogen gas, and the reaction liquid was taken out of the autoclave. The reaction liquid was filtered at a hot state to separate the catalyst from a filtrate. The filtrate was concentrated by evaporating water under reduced pressure with a rotary evaporator, thereby precipitating a crystal. The precipitated crystal was separated through solid-liquid separation at room temperature and dried to give 481 g of 1,2,4,5-cyclohexanetetracarboxylic acid (yield 85.0%).

Subsequently, 450 g of the resultant 1,2,4,5-cyclohexanetetracarboxylic acid and 4000 g of acetic anhydride were put into a 5-liter separable glass flask (equipped with a Dimroth condenser), and while stirring, the reactor was purged with nitrogen gas. This was heated up to the reflux temperature of the solvent under the nitrogen gas atmosphere, and the solvent was refluxed for 10 minutes. While stirring, this was cooled to room temperature to precipitate a crystal. The precipitated crystal was separated through solid-liquid separation and dried to give a primary crystal. Further, the separated mother liquid was concentrated under reduced pressure using a rotary evaporator to precipitate a crystal. The crystal was separated through solid-liquid separation and dried to give a secondary crystal. The primary crystal and the secondary crystal were combined to give 375 g of 1,2,4,5-cyclohexanetetracarboxylic anhydride (yield in anhydration, 96.6%).

Example 1

In a nitrogen stream atmosphere, as a diamine, 20.697 g (0.065 mol) of 2,2'-bis(trifluoromethyl)benzidine, 5.998 g (0.028 mol) of 3,3'-dihydroxybenzidine as a phenolic hydroxyl group-containing diamine, and as an organic solvent, 62.73 g of γ-butyrolactone were put into a 500-mL five-neck flask equipped with a thermometer, a stirrer, a nitrogen-introducing duct, a side tube-having dropping funnel, a Dean Stark unit and a condenser, and dissolved therein. 20.688 g (0.092 mol) of 1,2,4,5-cyclohexanetetracarboxylic dianhydride synthesized in Production Example 1 and as an imidation catalyst, 4.67 g (0.05 mol) of trimethylamine, were dropwise added thereto in one operation. After the addition, this was heated up to 180° C., and refluxed for 2 hours while the distillate was removed as needed. The finish of water distillation was confirmed, and this was cooled to 60° C. to give a polyimide resin solution. The number-average molecular weight of the polyimide resin was 48,900.

After this was cooled, 220 g of silica microparticles "DMAC-ST" (mean particle size 11 nm, silica content 20% by mass, N,N-dimethylacetamide solution: by Nissan Chemical Industries, Ltd.) were added, and stirred for 2 hours to give a polyimide resin composition.

The resultant polyimide resin composition was coated onto a glass plate, and held on a hot plate at 100° C. for 60 minutes to remove the organic solvent through evaporation, thereby giving a self-supporting colorless transparent primary-dried film. The film was fixed on a stainless frame, and heated in a hot air drier at 250° C. for 2 hours to evaporate the organic solvent thereby giving a polyimide film having a thickness of 50 μm. The results are shown in Table 1.

Example 2

In a nitrogen stream atmosphere, as a diamine, 18.515 g (0.050 mol) of 4,4'-bis(4-aminophenoxy)biphenyl, 2.719 g (0.013 mol) of 3,3'-dihydroxybenzidine as a phenolic hydroxyl group-containing diamine, and as organic solvents, 42.31 g of γ-butyrolactone and 10.58 g of N,N-dimethylacetamide were put into a 500-mL five-neck flask equipped with a thermometer, a stirrer, a nitrogen-introducing duct, a side tube-having dropping funnel, a Dean Stark unit and a condenser, and dissolved therein. 14.072 g (0.063 mol) of 1,2,4,5-cyclohexanetetracarboxylic dianhydride synthesized in Production Example 1 and as an imidation catalyst, 0.3 g (0.005 mol) of trimethylamine, were dropwise added thereto in one operation. After the addition, this was heated up to 180° C., and refluxed for 1 hour while the distillate was removed as needed. The finish of water distillation was confirmed, and this was cooled to 60° C. to give a polyimide resin solution. The number-average molecular weight of the polyimide resin was 385,000.

After this was cooled to 60° C., 165 g of silica microparticles "DMAC-ST" (mean particle size 11 nm, silica content 20% by mass, N,N-dimethylacetamide solution: by Nissan Chemical Industries, Ltd.) were added, and stirred for 2 hours to give a polyimide resin composition.

Using the resultant polyimide resin composition and in the same manner as in Example 1, a polyimide film having a thickness of 50 μm was produced. The results are shown in Table 1.

Example 3

In a nitrogen stream atmosphere, as a diamine, 20.244 g (0.055 mol) of 4,4'-bis(4-aminophenoxy)biphenyl, 1.321 g (0.006 mol) of 3,3'-dihydroxybenzidine as a phenolic hydroxyl group-containing diamine, and as organic solvents, 42.24 g of γ-butyrolactone and 10.56 g of N,N-dimethylacetamide were put into a 500-mL five-neck flask equipped with a thermometer, a stirrer, a nitrogen-introducing duct, a side tube-having dropping funnel, a Dean Stark unit and a condenser, and dissolved therein. 13.676 g (0.061 mol) of 1,2,4,5-cyclohexanetetracarboxylic dianhydride synthesized in Production Example 1 and as an imidation catalyst, 0.3 g (0.005 mol) of trimethylamine, were dropwise added thereto in one operation. After the addition, this was heated up to 180° C., and refluxed for 1 hour while the distillate was removed as needed. The finish of water distillation was confirmed, and this was cooled to 60° C. to give a polyimide resin solution. The number-average molecular weight of the polyimide resin was 423,000.

After this was cooled to 60° C., 165 g of silica microparticles "DMAC-ST" (mean particle size 11 nm, silica content 20% by mass, N,N-dimethylacetamide solution: by Nissan Chemical Industries, Ltd.) were added, and stirred for 2 hours to give a polyimide resin composition.

Using the resultant polyimide resin composition and in the same manner as in Example 1, a polyimide film having a thickness of 50 μm was produced. The results are shown in Table 1.

Example 4

In a nitrogen stream atmosphere, as a diamine, 15.523 g (0.048 mol) of 2,2'-bis(trifluoromethyl)benzidine, 4.498 g (0.021 mol) of 3,3'-dihydroxybenzidine as a phenolic hydroxyl group-containing diamine, and as an organic solvent, 65.91 g of γ-butyrolactone were put into a 500-mL five-neck flask equipped with a thermometer, a stirrer, a nitrogen-introducing duct, a side tube-having dropping funnel, a Dean Stark unit and a condenser, and dissolved therein. 15.516 g (0.069 mol) of 1,2,4,5-cyclohexanetetracarboxylic dianhydride synthesized in Production Example 1 and as an imidation catalyst, 3.50 g (0.05 mol) of trimethylamine, were dropwise added thereto in one operation. After the addition, this was heated up to 170° C., and refluxed for 5 hours while the distillate was removed as needed. The finish of water distillation was confirmed, and this was cooled to 60° C. to give a polyimide resin solution. The number-average molecular weight of the polyimide resin was 48,900.

After this was cooled to 60° C., 110 g of silica microparticles "DMAC-ST" (mean particle size 11 nm, silica content 20% by mass, N,N-dimethylacetamide solution: by Nissan Chemical Industries, Ltd.) were added, and stirred for 2 hours to give a polyimide resin composition.

Using the resultant polyimide resin composition and in the same manner as in Example 1, a polyimide film having a thickness of 50 μm was produced. The results are shown in Table 1.

Example 5

In a nitrogen stream atmosphere, as diamines, 13.696 g (0.043 mol) of 2,2'-bis(trifluoromethyl)benzidine and 2.851 g (0.014 mol) of 4,4'-diaminodiphenyl ether, 3.087 g (0.014 mol) of 3,3'-dihydroxybenzidine as a phenolic hydroxyl group-containing diamine, and as an organic solvent, 66.05 g of γ-butyrolactone were put into a 500-mL five-neck flask equipped with a thermometer, a stirrer, a nitrogen-introducing duct, a side tube-having dropping funnel, a Dean Stark unit and a condenser, and dissolved therein. 15.971 g (0.071 mol) of 1,2,4,5-cyclohexanetetracarboxylic dianhydride synthesized in Production Example 1 and as an imidation catalyst, 3.60 g (0.05 mol) of trimethylamine, were dropwise added thereto in one operation. After the addition, this was heated up to 170° C., and refluxed for 5 hours while the distillate was removed as needed. The finish of water distillation was confirmed, and this was cooled to 60° C. to give a polyimide resin solution.

After this was cooled to 60° C. 110 g of silica microparticles "DMAC-ST" (mean particle size 11 nm, silica content 20% by mass, N,N-dimethylacetamide solution: by Nissan Chemical Industries, Ltd.) were added, and stirred for 2 hours to give a polyimide resin composition.

Using the resultant polyimide resin composition and in the same manner as in Example 1, a polyimide film having a thickness of 50 μm was produced. The results are shown in Table 1.

Example 6

A polyimide resin solution was produced in the same manner as in Example 2, and 385 g of silica microparticles "DMAC-ST" (mean particle size 11 nm, silica content 20% by mass, N,N-dimethylacetamide solution: by Nissan Chemical Industries, Ltd.) were added, and stirred for 2 hours to give a polyimide resin composition.

Using the resultant polyimide resin composition and in the same manner as in Example 2, a polyimide film having a thickness of 50 μm was produced. The results are shown in Table 1.

Comparative Example 1

In a nitrogen stream atmosphere, as a diamine, 21.728 g (0.059 mol) of 4,4'-bis(4-aminophenoxy)biphenyl, and, as organic solvents, 65.64 g of γ-butyrolactone and 16.41 g of N,N-dimethylacetamide were put into a 500-mL five-neck flask equipped with a thermometer, a stirrer, a nitrogen-introducing duct, a side tube-having dropping funnel, a Dean Stark unit and a condenser, and dissolved therein. 13.481 g (0.060 mol) of 1,2,4,5-cyclohexanetetracarboxylic dianhydride synthesized in Production Example 1 and an imidation catalyst, 0.3 g (0.005 mol) of trimethylamine, were dropwise added thereto in one operation. After the addition, this was heated up to 180° C., and refluxed for 3 hours while the distillate was removed as needed. The finish of water distillation was confirmed, and this was cooled to 60° C. to give a polyimide resin solution.

After this was cooled to 60° C., 165 g of silica microparticles "DMAC-ST" (mean particle size 11 nm, silica content 20% by mass, N,N-dimethylacetamide solution: by Nissan Chemical Industries, Ltd.) were added, and stirred for 2 hours to give a polyimide resin composition.

Using the resultant polyimide resin composition and in the same manner as in Example 1, a polyimide film having a thickness of 50 μm was produced. The results are shown in Table 1.

Comparative Example 2

In a nitrogen stream atmosphere, 16.024 g (0.043 mol) of 4,4'-bis(4-aminophenoxy)biphenyl and 5.343 g (0.019 mol) of 3,3'-dicarboxy-4,4'-diaminodiphenylmethane as diamines, and, as organic solvents, 52.35 g of γ-butyrolactone and 13.09 g of N,N-dimethylacetamide were put into a 500-mL five-neck flask equipped with a thermometer, a stirrer, a nitrogen-introducing duct, a side tube-having dropping funnel, a Dean Stark unit and a condenser, and dissolved therein. 13.919 g (0.062 mol) of 1,2,4,5-cyclohexanetetracarboxylic dianhydride synthesized in Production Example 1 and as an imidation catalyst, 0.3 g (0.005 mol) of trimethylamine, were dropwise added thereto in one operation. After the addition, this was heated up to 180° C., and refluxed for 1 hour while the distillate was removed as needed. The finish of water distillation was confirmed, and this was cooled to 60° C. to give a polyimide resin solution.

After this was cooled to 60° C., 165 g of silica microparticles "DMAC-ST" (mean particle size 11 nm, silica content 20% by mass, N,N-dimethylacetamide solution: by Nissan Chemical Industries, Ltd.) were added, and stirred for 2 hours to give a polyimide resin composition.

Using the resultant polyimide resin composition and in the same manner as in Example 1, a polyimide film having a thickness of 50 μm was produced. The results are shown in Table 1.

Comparative Example 3

In a nitrogen stream atmosphere, as a diamine, 18.816 g (0.059 mol) of 2,2'-bis(trifluoromethyl)benzidine, 5.452 g (0.025 mol) of 3,3'-dihydroxybenzidine as a phenolic hydroxyl group-containing diamine, and an organic solvent, 64.53 g of γ-butyrolactone, were put into a 500-mL five-neck flask equipped with a thermometer, a stirrer, nitrogen-introducing duct, a side tube-having dropping funnel, a Dean Stark unit and a condenser, and dissolved therein. 18.807 g (0.084 mol) of 1,2,4,5-cyclohexanetetracarboxylic dianhydride synthesized in Production Example 1 and as an imidation catalyst, 4.24 g (0.05 mol) of trimethylamine, were dropwise added thereto in one operation. After the addition, this was heated up to 180° C., and refluxed for 5 hours while the distillate was removed as needed. The finish of water distillation was confirmed, and this was cooled to 60° C. to give a polyimide resin solution.

After this was cooled to 60° C., 110 g N,N-dimethylacetamide was added, and stirred for 2 hours to give a polyimide resin composition.

Using the resultant polyimide resin composition and in the same manner as in Example 1, a polyimide film having a thickness of 50 μm was produced. The results are shown in Table 1.

The abbreviations in the Table are as follows:
HPMDA: 1,2,4,5-cyclohexanetetracarboxylic anhydride
HAB: 3,3'-dihydroxybenzidine
TFMB: 2,2'-bis(trifluoromethyl)benzidine
BAPB: 4,4'-bis(4-aminophenoxy)biphenyl
MBAA: 3,3'-dicarboxy-4,4'-diaminodiphenylmethane
ODA: 4,4'-diaminodiphenyl ether

INDUSTRIAL APPLICABILITY

The polyimide film formed using the polyimide resin composition of the present invention is excellent in transparency and heat resistance and has a low thermal linear expansion coefficient, and is therefore free from dimensional change by heat, and consequently, this is favorably used as films for various members. Concretely, the film is expected to be used in color filters, flexible displays, semiconductor members, optical members and the like. In addition, the laminate of the present invention is favorably used as a substrate for printed-wiring assemblies.

The invention claimed is:

1. A polyimide resin composition comprising:
   a polyimide resin produced by reactants consisting of (A) a tetracarboxylic dianhydride and (B) a diamine; and
   silica microparticles,
   in a ratio by mass of from 25/75 to 60/40;
   wherein the tetracarboxylic dianhydride (A) consists of at least one cycloalkanetetracarboxylic dianhydride; and
   wherein the diamine (B) consists of from 10 to 90 mol % of a phenolic hydroxyl group-containing diamine represented by the following formula (1) and from 10 to 90 mol % of a diamine other than the phenolic hydroxyl group-containing diamine;

TABLE 1

| | Polyimide Resin Composition | | | | Results of Film Evaluation | | |
|---|---|---|---|---|---|---|---|
| | Constitution of Polyimide Resin | | | | | | |
| | | Diamine (B) | | | | | |
| | Tetracarboxylic Dianhydride (A) (molar ratio) | Phenolic Hydroxyl Group-Containing Diamine (molar ratio) | Other Diamine (molar ratio) | Polyimide Resin/Silica Microparticles (ratio by mass) | Total Light transmittance (%) | Thermal Linear Expansion Coefficient (ppm/° C.) | Glass Transition Temperature (° C.) |
| Example 1 | HPMDA 100 | HAB 30 | TFMB 70 | 50/50 | 91.2 | 27 | 410 |
| Example 2 | HPMDA 100 | HAB 20 | BAPB 80 | 50/50 | 87.4 | 30 | 318 |
| Example 3 | HPMDA 100 | HAB 10 | BAPB 90 | 50/50 | 88.0 | 31 | 306 |
| Example 4 | HPMDA 100 | HAB 30 | TFMB 70 | 60/40 | 90.7 | 35 | 410 |
| Example 5 | HPMDA 100 | HAB 20 | TFMB/ODA 60/20 | 60/40 | 90.9 | 36 | 369 |
| Example 6 | HPMDA 100 | HAB 20 | BAPB 80 | 30/70 | 89.8 | 21 | 320 |
| Comparative Example 1 | HPMDA 100 | — | BAPB 100 | 50/50 | cloudy | immeasurable* | immeasurable* |
| Comparative Example 2 | HPMDA 100 | — | BAPB/MBAA 70/30 | 50/50 | cloudy | immeasurable* | immeasurable* |
| Comparative Example 3 | HPMDA 100 | HAB 30 | TFMB 70 | 100/0 | 89.1 | 52 | 410 |

*The film was too brittle to be analyzed.

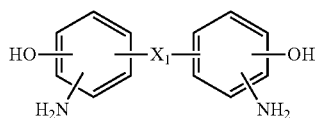

(1)

wherein, in the formula, $X_1$ represents a direct bond, —$CH_2$—, —O—, —S—, —$SO_2$—, —CONH—, —CO—, or —$C(CH_3)_2$—; and wherein the diamine other than the phenolic hydroxyl group-containing diamine consists of 2,2'-bis(trifluoromethyl)benzidine, 4,4'-bis(4-aminophenoxy)biphenyl, or a combination of 2,2'-bis(trifluoromethyl)benzidine and 4,4'-diaminodiphenyl ether.

2. The polyimide resin composition according to claim 1, wherein the cycloalkanetetracarboxylic dianhydride is 1,2,4,5-cyclohexanetetracarboxylic dianhydride.

3. The polyimide resin composition according to claim 1, wherein the diamine represented by the formula (1) is a diamine represented by the following formula (2):

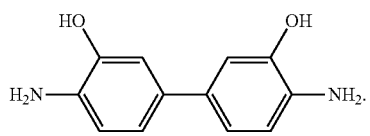

(2)

4. The polyimide resin composition according to claim 1, wherein the diamine (B) consists of from 10 to 90 mol % of the phenolic hydroxyl group-containing diamine represented by the formula (1) and from 10 to 90 mol % of 2,2'-bis(trifluoromethyl)benzidine.

5. The polyimide resin composition according to claim 1, wherein the silica microparticles have a mean particle size of from 1 to 100 nm.

6. The polyimide resin composition according to claim 1, wherein the silica microparticles are ones surface-treated with an amino group-containing silane coupling agent.

7. A polyimide film formed using the polyimide resin composition of claim 1.

8. The polyimide film according to claim 7, which has a total light transmittance of 85% or more when having a thickness of 50 μm.

9. A laminate comprising:
   a substrate selected from plastic film, silicon wafer, metal foil and glass; and
   a polyimide resin layer formed using the polyimide resin composition of claim 1.

10. The laminate according to claim 9, wherein the substrate is copper foil.

\* \* \* \* \*